United States Patent
Das et al.

(10) Patent No.: US 8,179,198 B2
(45) Date of Patent: May 15, 2012

(54) VARIABLE GAIN AMPLIFIER HAVING AUTOMATIC POWER CONSUMPTION OPTIMIZATION

(75) Inventors: Abhijit Kumar Das, Dallas, TX (US); Michel Frechette, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/840,933

(22) Filed: Jul. 21, 2010

(65) Prior Publication Data

US 2011/0210793 A1     Sep. 1, 2011

Related U.S. Application Data

(60) Provisional application No. 61/230,352, filed on Jul. 31, 2009.

(51) Int. Cl.
   *H03G 3/10* (2006.01)
(52) U.S. Cl. .................................. 330/285; 330/254
(58) Field of Classification Search .................. 330/254, 330/260, 261, 278, 285, 296
   See application file for complete search history.

(56) References Cited

U.S. PATENT DOCUMENTS

| | | | |
|---|---|---|---|
| 5,196,742 A * | 3/1993 | McDonald | 327/65 |
| 5,631,891 A * | 5/1997 | Moritsugu et al. | 369/124.11 |
| 6,246,289 B1 * | 6/2001 | Pisati et al. | 330/254 |
| 6,639,447 B2 * | 10/2003 | Manku et al. | 327/359 |
| 6,753,732 B1 * | 6/2004 | Moreland | 330/261 |
| 7,061,300 B2 * | 6/2006 | Pisati et al. | 327/357 |

\* cited by examiner

*Primary Examiner* — Henry Choe
(74) *Attorney, Agent, or Firm* — Alan A. R. Cooper; Wade James Brady, III; Frederick J. Telecky, Jr.

(57) ABSTRACT

A variable gain amplifier may include a master amplifier that may be configured to generate a first current and a diode coupled with the master amplifier so that the first current passes through the diode which, when the first current is passing through the diode, generates a diode voltage signal. According to embodiments, an error amplifier may include a first input configured to receive a gain control voltage signal and a second input configured to receive the diode voltage signal. The output of the error amplifier may provide a feedback signal. The amplifier may include a circuit configured to generate at least one voltage control signal based on the feedback signal and a slave amplifier configured to adjust a gain amount based on the at least one voltage control signal.

19 Claims, 2 Drawing Sheets

US 8,179,198 B2

VARIABLE GAIN AMPLIFIER HAVING AUTOMATIC POWER CONSUMPTION OPTIMIZATION

RELATED APPLICATIONS

The present application claims priority to provisional Patent Application Ser. No. 61/230,352 filed Jul. 31, 2009, the disclosure of which is incorporated by reference herein, in its entirety.

BACKGROUND

Embodiments relate to communications networks and to RF amplifiers. Embodiments relate to variable gain amplifiers.

Amplifiers with wide gain programmability range that is linear in dB scale may be an integral part of many systems. Building an amplifier with large variable gain range which can be controlled linearly in dB scale may be difficult in CMOS processes.

These amplifiers may consume large amounts of power to maintain linearity at high output power mode. This power may be wasted toward ground while operating in low power. In certain systems (for example, a wireless communication transmitter) such amplifiers may be operated with low power and may therefore waste a lot of energy.

In several different types of communications systems a final RF power amplifier may be expected to deliver large output power while maintaining good linearity. This may often result in large power consumption. Such amplifiers may have been operated with low output power most of the time and thus large amounts of power may be wasted.

Variable gain amplifiers (VGA) may be useful in many wireless communications technologies and a final RF power transmission may be expected to have a wide gain programmability range that is linear in the dB scale. Building a VGA that is linear in the dB scale in a CMOS process may be difficult.

In some design implementations, almost all of the functional blocks of a power amplifier may have large dynamic ranges to maintain linearity in dB gain steps. Such a design may waste a lot of power at low gain mode. The linearity of a VGA at high output power determines the bias current in the amplifier and hence at low output power mode, most of this is wasted towards ground. Attempts to address this issue may increase complexity and add circuitry, and can introduce additional problems to overcome.

There remains a need, therefore, for a VGA architecture with built-in power optimization that can work with large linear-in-dB gain programmability range and also include a fine and accurate gain step.

SUMMARY

Embodiments relate to a VGA architecture that may include a master amplifier configured to generate a first current and a diode coupled with the master amplifier so that the first current passes through the diode which, when the first current is passing through the diode, generates a diode voltage signal. The VGA may also include an error amplifier having a first input configured to receive a gain control voltage signal, a second input configured to receive the diode voltage signal, and an output configured to provide a feedback signal. There may also be a circuit configured to generate at least one voltage control signal based on the feedback signal and a slave amplifier configured to adjust a gain amount based on the at least one voltage control signal.

It is understood that other embodiments will become readily apparent to those skilled in the art from the following description, wherein it is shown and described only various embodiments by way of illustration. As will be realized, different embodiments may be available and its several details may be capable of modification in various other respects, all without departing from the spirit and scope of the disclosure. Accordingly, the drawings and description are to be regarded as illustrative in nature and not as restrictive.

DRAWINGS

DESCRIPTION

A variable gain amplifier (VAC) according to embodiments is described herein. In some instances, well known structures and components are shown in block diagram form in order to avoid obscuring the concepts of the invention.

Figure 1:
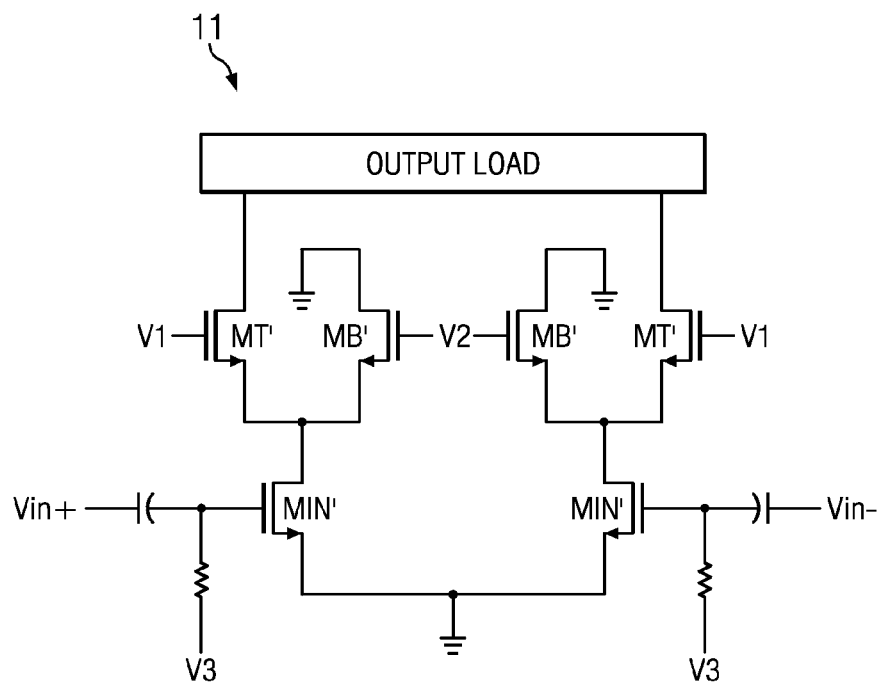
FIG. 1 depicts an exemplary power amplifier that can be controlled, according to embodiments.

FIG. 1 illustrates an exemplary RF power amplifier, according to embodiments. One of ordinary skill will recognize that other amplifier topologies may be used as well without departing from the scope of the disclosure. As explained below, an amplifier of FIG. 1 may be referred to as a slave amplifier and the devices of the amplifier can be selected to have performance characteristics based on performance characteristics of a master amplifier.

According to embodiments, the slave amplifier 11 of FIG. 1 may be a pseudo-differential common source amplifier with three control voltages. The voltage V1 is a bias voltage preferably determined based on linearity needs and is set in a way that the input pair MIN' remains in saturation with allowable input and output signal swing. The voltage V2 controls the amount of output power diverted to ground and therefore controls the gain of the RF amplifier. The voltage V3 determines the bias point of the input pair MIN' and controls the bias point of the amplifier 11. By efficiently controlling the voltage V2 and V3 a power optimized high dynamic range VGA can be achieved.

According to embodiments, the power amplifier 11 of FIG. 1 may be controlled by both a power control signal and a gain control signal. Additionally, the gain control signal may be converted to an exponential control signal so that the amplifier achieves gain steps that are linear in dB. According to embodiments, a master amplifier circuit is described with which control of the slave amplifier 11 can be achieved.

Figure 2:
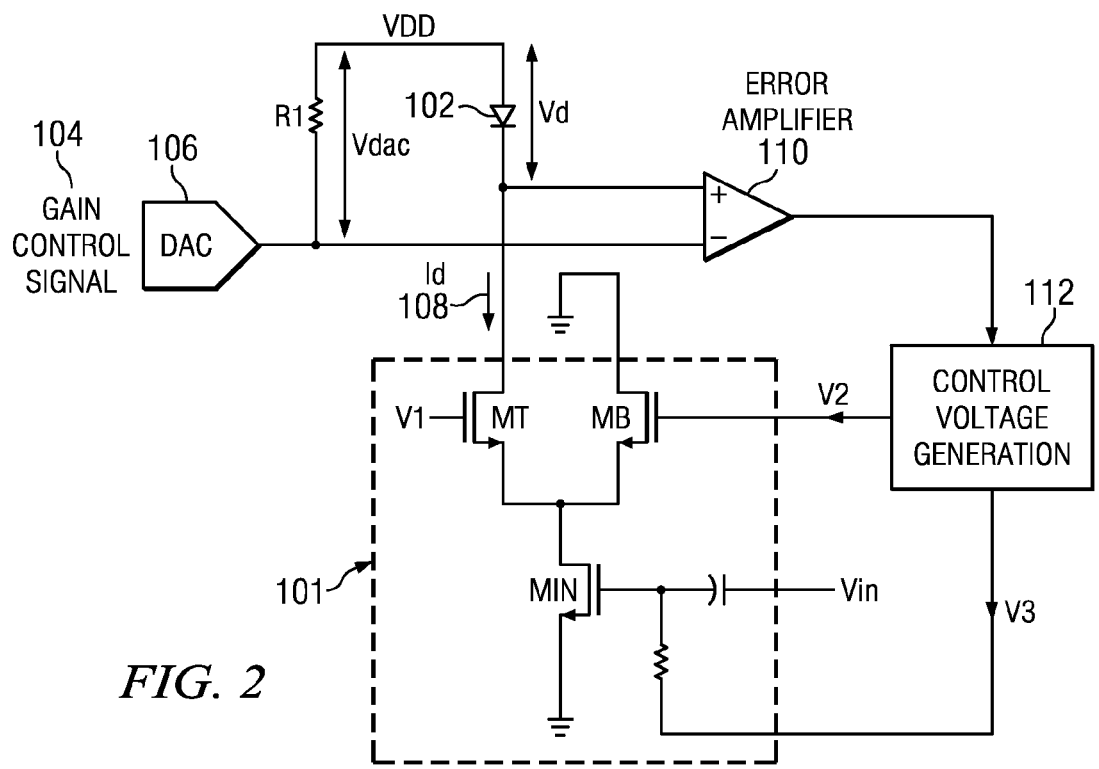
FIG. 2 depicts a block diagram of a VGA topology including an exemplary master amplifier, according to embodiments.

FIG. 2 illustrates a block diagram of a master amplifier 101 for use in a master-slave topology, according to embodiments. The circuitry of FIG. 2 may include additional elements that will be more fully described with respect to FIG. 3. The master amplifier 101 is a scaled down version of the slave amplifier 11 in the signal path described with respect to FIG. 1. According to embodiments, a basic P-N junction diode 102 may be used that is relatively easy to construct accurately in a CMOS process. Such a diode 102 has the desired exponential characteristics to be useful in embodiments so that instead of converting a linear control signal into an exponential control signal, the exponential characteristics of the diode may be used. According to embodiments, other configurations could be used.

The block diagram of FIG. 2 includes control voltages V1, V2, and V3. According to embodiments, these voltages may be the same voltage signals used in the slave amplifier 11 and have similar purposes. According to embodiments, the voltage V1 is a bias voltage that is selected based on linearity requirements and is selected to so that MIN remains in saturation. The voltage V2 controls the amount of output power that is diverted to ground (or bypassed) and hence controls the gain of the amplifier 101. The voltage V3 controls the bias of the input NMOS device MN and controls the bias current of the amplifier 101.

As shown in FIG. 2, a gain control signal 104 may be provided to a digital-to-analog converter 106, according to embodiments. Instead of converting the linear control signal 104 into an exponential control signal, the exponential characteristics of the diode 102 may be used in feedback of the master amplifier 101. One beneficial result is that only the master amplifier 101 and the diode 102 need a large dynamic range. According to embodiments, although the master amplifier 101 may be implemented as a pseudo-differential amplifier, it can also be a single-ended structure as shown in FIG. 2. According to embodiments, the DAC 106 and the resistor R1 may not be necessary. According to embodiments, any method could be used to ensure a proper control voltage at the second input of the error amplifier.

According to embodiments, the circuitry of FIG. 2 includes only a single control signal 104 that simultaneously controls both power consumption and power gain of the system.

According to embodiments, the circuitry of FIG. 2 can be described as follows. The current $I_d$ 108 flowing through the master amplifier 101 can be expressed as a function of the transconductance of the MOSFETs (MT, MB, and MN).

$$I_d = K \cdot V_{ON}^2 \cdot ((gm_1)/(gm_1 + gm_2)) \tag{1}$$

In equation (1), K is a constant based on the device MIN and $V_{ON}$ is the gate overdrive voltage (i.e., $V_{GS} - V_T$) of the device MIN. In equation (1) and the following equations, $gm_0$, $gm_1$, and $gm_2$ refer, respectively, to the transconductance of device MIN, device MT, and device MB.

According to embodiments, $I_d$ of equation (1) is the same current that is flowing through the diode 102, which allows writing the following equation for the voltage $V_d$ across the diode:

$$V_d = V_T \cdot \log_e(I_d/I_s) \tag{2}$$

where $V_T$ is the thermal constant of the diode 102 and $I_s$ is the saturation current. Additional values may be defined as follows:

$$\phi = -V_T \cdot \log_e(I_s) \tag{3}$$

$$\mu = (\eta V_T)/(\log_{10}(e)) \text{ (where } \eta \text{ is process value that can be about 1.6)} \tag{4}$$

$$\mu' = 2\mu \tag{5}$$

$$\phi' = \phi - \mu \cdot \log_{10}(K) \tag{6}$$

$$\delta = \mu \cdot \log_{10}(K \cdot V_{on}^2) + \phi \tag{7}$$

This allows writing two equations for $V_d$ based on the region of operation of the different MOSFETs.

When the system is operating such that substantially no power is being bypassed to ground (i.e., V2 is close to 0 in this example) then $V_d$ can be expressed as:

$$V_d = \mu' \cdot \log_{10}(gm_0) + \phi' \text{ (where } gm_0 = K \cdot V_{ON}) \tag{8}$$

In the other region of operation, the transconductance of the input device MIN is constant (i.e., V3 is substantially constant), then the voltage across the diode can be expressed as:

$$V_d = \mu \cdot \log_{10}((gm_1)/(gm_1 + gm_2)) + \delta \tag{9}$$

In the above equation 8 can be considered a constant because V3 is substantially a constant in this region of operation.

According to embodiments, the master amplifier 101 and the slave amplifier 11 share substantially the same structure and the transconductances of the devices (MT', MB'MIN') of the slave amplifier 11 can be selected so as to have fixed ratios to the transconductances of the corresponding devices (MT, MB, MIN) of the master amplifier 101. According to embodiments, the same control voltages V1, V2, and V3 are supplied to the two amplifiers 11, 111. As a result, the output power of the slave amplifier can be expressed in terms of the of the amplifier elements of the master amplifier 101. According to embodiments, the gain of the VGA 11 can be expressed as:

$$A_{db} = 20 \cdot \log_{10}(gm_0 \cdot (gm_1/(gm_1 + gm_2))) + \beta \tag{10}$$

where $\beta$ is a constant depending on the fixed ratio of the master and slave amplifier devices and the output load impedance.

Utilizing equation (10) with equations (8) and (9) allows rewriting the VGA gain in the two regions of operation. When V2 is close to zero:

$$A_{db} = 20 \cdot ((V_d - \phi')/\mu') + \beta \tag{11}$$

When $gm_0$ is substantially constant (i.e., V3 is fixed at the lower power consumption limit of the amplifier) the VGA gain can be expressed as:

$$A_{db} = 20 \cdot ((V_d - \delta)/\mu) + \gamma \tag{12}$$

where $\gamma = 10 \cdot \log_{10}(gm_0) + \beta$ and can be considered as a constant when $gm_0$ is substantially a constant.

From the above equations a slope of the VGA gain curve can be calculated. For example, the slope in equation (11) is $20 \cdot \log 10(e)/2/\eta/Vt$. For example, if it is assumed that $\eta=1.6$, the slope can be calculated to be 104 dB/volt and the slope in equation (12) is 208 dB/volt. Thus, the slope, in each respective region, is substantially constant and preferably depends only on the thermal constant, $V_T$ of the diode 102. Thus, a simple pre-distortion of the control signal 102 could be used to ensure the slope of the VGA gain is independent of process, temperature or region of operation. Also, the slope of the VGA gain curve is low in high power output mode, which is also the high power consumption mode, and thereby allows finer control in that region.

In FIG. 2, the difference between the control voltage ($V_{DAC}$) and the diode voltage $V_d$ is provided to an amplifier 110 where it is amplified and provided to circuitry 112 that generates the control voltages V2 and V3. According to embodiments, the amplifier 110 may, for example, be a folded cascade amplifier with differential input and single ended output. The offset of the amplifier 110 can change the constant coefficients in equations (11 and 12) but will not change the characteristics of the VGA. According to embodiments, the DC gain and bandwidth of the amplifier are not critical requirements to ensure proper operation of the VGA.

Figure 3:
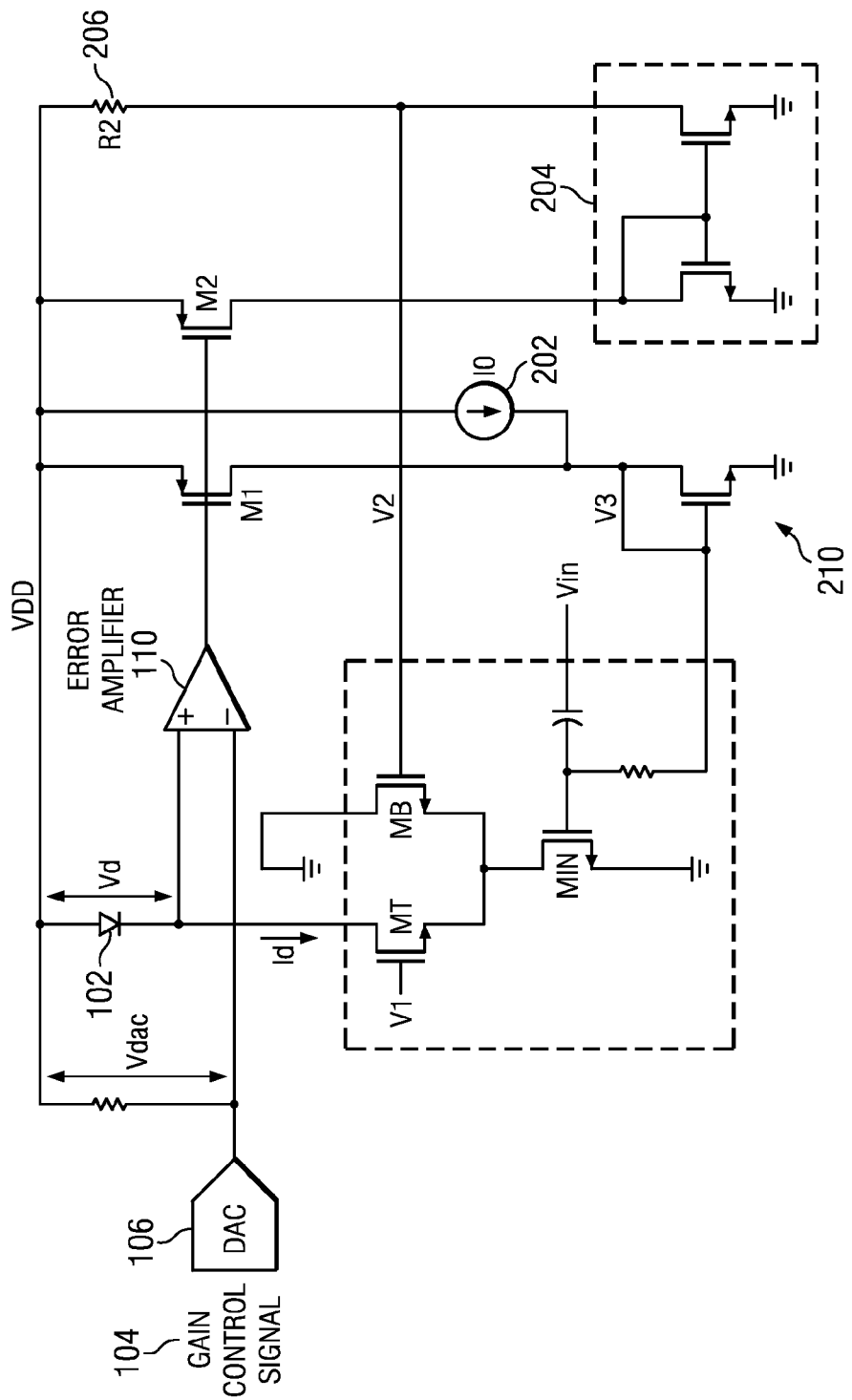
FIG. 3 depicts an exemplary circuitry of a VGA topology with an exemplary circuit implementation of the Control Voltage Generation of FIG. 2, according to embodiments.

FIG. 3 illustrates a particular circuit implementation, according to embodiments. The current through the master amplifier 101 ($I_d$) is the same as the current through the diode 102. According to embodiments, an error amplifier 110 may be used to amplify the error signal between the control voltage $V_{DAC}$ and the voltage $V_d$ across the diode 102. The resulting error signal voltage output from the amplifier 110 may be used to control two matched current sources M1 and M2 as shown in FIG. 3. According to embodiments, the current through M2 is mirrored again in mirror 204 in order to generate a voltage drop from the supply ($V_{dd}$) across resistor R2 (206). According to embodiments, the resulting voltage V2 is the control voltage which feeds the gate of device MB.

According to embodiments, the current through M1 and a constant current source $I_0$ (202) flows over an NMOS diode 210 to generate a voltage V3. The current $I_0$ (202) can beneficially be selected based on the minimum current required in the slave amplifier to maintain a thermal noise level and linearity in low power delivery mode. According to embodiments, the value of the resistor R2 (206) can beneficially be adjusted such that with a small current (e.g., approximately $I_s$) it generates a drop ($I_s$*R2) which is sufficient to push the device MB into cutoff. For example, $I_s$ significantly less than $I_0$ (202).

According to embodiments, in operation at very low power output (i.e., $V_{DAC}$ is small) the loop stabilizes with low current flowing through M1 and M2. Because this current is less than $I_s$, the master amplifier 101 operates with the minimum current decided by $I_0$ (202) and a large amount of this power is diverted to the ground through the bypass path as V2 is relatively high.

According to embodiments, when the gain control voltage 104 is increased (resulting in $V_{DAC}$ increasing) the current through M1 and M2 is increased by the feedback loop reducing the voltage V2. The reduction of V2 cause $gm_2$ to reduce and increases the gain of the master amplifier 101. The loop can then stabilize in a steady state (see equation (12)). According to embodiments, an increase in the gain control 104 will increase the current through M1 and M2 and the current will continue to increase until the current through M2 reaches $I_s$. At that point, the bypass path shuts off. According to embodiments, the amplifier may reach its maximum power gain with the minimum current.

After the point described above, any further increases in $V_{DAC}$ will force the feedback loop to increase the current through M1 and M2 until the loop can stabilize in a steady state (see equation (11)). According to embodiments, at the higher gain setting, increases in the gain of the amplifier will increase the power being consumed. This behavior maintains the linearity characteristics at the higher output power settings. According to embodiments, in this operating region, V2 is saturated close to ground causing little to no power wastage through the bypass path.

The loop dynamics move in a reverse manner when the gain control 104 reduces the gain. Furthermore, the saturation of V2 and the selecting $I_s$ to be very small compared to $I_0$ substantially prevents any gain settings being achieved by increased power consumption (i.e., a relatively higher V3 in this example) while diverting a relatively large amount of power to ground (i.e., a high V2 voltage in this example).

Although source degeneration has not been expressly discussed, one of ordinary skill will recognize that either inductive or resistive source degeneration can be approximated by an equivalent resistance in the master amplifier. Because it is beneficial to have an upper limit of power consumption, adding degeneration or ensuring saturation in power consumption may be desired. In particular, ensuring saturation of the error amplifier 110 in such a way that V3 has a fixed upper limit may be beneficial. For example, M1 can be sized in a way that when the error amplifier output reaches ground, V3 voltage is such that the main amplifier consumes equal or below the maximum current limit.

According to embodiments, a VGA topology has been described that implements gain control that is linear in a dB scale. According to embodiments, the slope of the VGA gain curve is independent of the process variation and has a known predictable dependency on temperature. The built in power control mechanism reduces power wastage and does not require a separate control thereby allowing a power efficient VGA with a wide dynamic range and linear-in-dB gain control.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but are to be accorded the full scope consistent with each claim's language, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. Also, the term "exemplary" is meant to indicate that some information is being provided as an example only as is not intended to mean that that information is somehow special or preferred. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A device, comprising:
a first amplifier configured to generate a first current;
a diode electrically connected to the first amplifier so that the first current passes through the diode, and configured to generate a diode voltage signal;
an error amplifier having a first input configured to receive a gain control voltage signal, a second input configured to receive the diode voltage signal, and an output configured to provide a feedback signal;
a circuit configured to generate at least one voltage control signal based on the feedback signal; and
a second amplifier configured to adjust a gain amount based on the at least one voltage control signal.

2. The device of claim 1, comprising a digital-to-analog converter configured to receive a digital gain control signal that controls a value of the gain control voltage.

3. The device of claim 1, wherein the first amplifier comprises:
a bypass MOSFET;
a through MOSFET; and
an input MOSFET.

4. The device of claim, 3 wherein a source of the through MOSFET and a source of the bypass MOSFET are electrically coupled with a drain of the input MOSFET.

5. The device of claim 3, wherein a first of the at least one voltage control signal is electrically coupled with a gate of the bypass MOSFET and a second of the at least one voltage control signal is electrically coupled with a gate of the input MOSFET.

6. The device of claim 3, wherein the first current is electrically coupled with a drain of the through MOSFET.

7. The device of claim 1, wherein the second amplifier comprises:
first and second through MOSFETs;
first and second bypass MOSFETs; and
first and second input MOSFETs.

8. The device of claim 7, wherein a first of the at least one voltage control signal is electrically coupled with a respective gate of each of the first and second bypass MOSFETs and a second of the at least one voltage control signals is electrically coupled with a respective gate of each of the first and second input MOSFETs.

9. The device claim 1, wherein the first amplifier comprises:
a master bypass MOSFET having a first transconductance value;
a master through MOSFET having a second transconductance value; and
a master input MOSFET having a third transconductance value;
and wherein the second amplifier comprises
first and second slave bypass MOSFETs, each having a fourth transconductance value;
first and second slave through MOSFETs, each having a fifth transconductance value; and
first and second slave input MOSFETs, each having a sixth transconductance value.

10. The device of claim 9, wherein:
a first of the at least one voltage control signal is electrically coupled with a respective gate of each of the master bypass MOSFET and each of the slave bypass MOSFETs; and
a second of the at least one voltage control signal is electrically coupled with a respective gate of each of the master input MOSFET and each of the slave input MOSFETs.

11. The device of claim 9, wherein:
the first transconductance value and the fourth transconductance value are selected to have a first fixed ratio;
the second transconductance value and the fifth transconductance value are selected to have a second fixed ratio; and
the third transconductance value and the sixth transconductance value are selected to have a third fixed ratio.

12. The device of claim 11, wherein the first, second, and third fixed ratios are substantially equal.

13. The device of claim 1, wherein the circuit comprises:
first and second matched current sources, comprising a first MOSFET and a second MOSFET;
a constant current source; and
a MOSFET diode;
wherein a combined current from a drain of the first MOSFET and the constant current source passes through the MOSFET diode to generate a first of the at least one control signal which is electrically coupled with a gate of an input MOSFET of the first amplifier.

14. The device of claim 1, wherein the circuit comprises:
first and second matched current sources, comprising a first MOSFET and a second MOSFET;
a current mirror electrically coupled with a drain of the second MOSFET; and
a resistor electrically coupled between the current mirror and a source of the second MOSFET;
wherein a current through the second MOSFET causes a voltage drop across the resistor to generate a first of the at least one control signal which is electrically coupled to a gate of a bypass MOSFET of the first amplifier.

15. A method, comprising:
providing a power amplifier, the power amplifier comprising a master amplifier and a slave amplifier;
providing a digital control signal to the power amplifier;
controlling both a power gain of the power amplifier and a power consumption of the power amplifier based on the digital control signal;
providing a first current through a diode to generate a diode voltage signal, wherein the first current passes through the master amplifier;
generating a gain control voltage based on the digital control signal; and
generating first and second control signals based on a difference between the diode voltage signal and the gain control voltage.

16. The method of claim 15, wherein power gain increments of the power amplifier occur substantially linearly in a dB scale.

17. The method of claim 15, comprising controlling both the power gain of the power amplifier and the power consumption of the power amplifier based on the first and second control signals.

18. The method of claim 15, comprising providing the first and second control signals to the master amplifier.

19. The method of claim 15, comprising providing the first and second control signals to the slave amplifier.

* * * * *